United States Patent
Kang et al.

(10) Patent No.: US 9,399,822 B2
(45) Date of Patent: Jul. 26, 2016

(54) LIQUID COMPOSITIONS AND METHODS OF FABRICATING A SEMICONDUCTOR DEVICE USING THE SAME

(71) Applicants: Samsung Electronics Co., Ltd., Suwon-si (KR); Samyoung Pure Chemicals Co., Ltd., Seoul (KR); Mitsubishi Gas Chemical Company, Inc., Tokyo (JP)

(72) Inventors: Dong-Min Kang, Seoul (KR); Hyungjun Jeon, Seoul (KR); Ingoo Kang, Yongin-si (KR); Jeong Kwon, Ulsan (KR); Jung-ig Jeon, Seoul (KR); Jungsik Choi, Seongnam-si (KR); Young Taek Hong, Hwaseong-si (KR); Akira Hosomi, Tokyo (JP); Tomoko Suzuki, Tokyo (JP)

(73) Assignees: Samsung Electronics Co., Ltd. (KR); Samyoung Pure Chemicals Co., Ltd. (KR); Mitsubishi Gas Chemical Company, Inc. (JP)

( * ) Notice: Subject to any disclaimer, the term of this patent is extended or adjusted under 35 U.S.C. 154(b) by 0 days.

(21) Appl. No.: 14/312,782

(22) Filed: Jun. 24, 2014

(65) Prior Publication Data

US 2015/0079782 A1 Mar. 19, 2015

(30) Foreign Application Priority Data

Sep. 17, 2013 (KR) ........................ 10-2013-0111882

(51) Int. Cl.
*H01L 21/44* (2006.01)
*C23F 1/18* (2006.01)
(Continued)

(52) U.S. Cl.
CPC ............ *C23F 1/18* (2013.01); *H01L 21/32134* (2013.01); *H01L 24/03* (2013.01); *H01L 24/05* (2013.01); *H01L 24/11* (2013.01); *H01L 24/13* (2013.01); *H01L 2224/0345* (2013.01); *H01L 2224/03912* (2013.01); *H01L 2224/0401* (2013.01); *H01L 2224/05009* (2013.01); *H01L 2224/05022* (2013.01); *H01L 2224/0558* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05166* (2013.01); *H01L 2224/05181* (2013.01);
(Continued)

(58) Field of Classification Search
USPC .......................................... 438/614; 252/79.1
See application file for complete search history.

(56) References Cited

U.S. PATENT DOCUMENTS 6,417,089 B1    7/2002   Kim et al.
8,389,397 B2    3/2013   Lei et al.
(Continued)

FOREIGN PATENT DOCUMENTS

JP    2002-231748 A    8/2002
JP    2008-028112 A    2/2008
(Continued)

*Primary Examiner* — Timor Karimy
(74) *Attorney, Agent, or Firm* — Myers Bigel & Sibley, P.A.

(57) ABSTRACT

The present inventive concepts provide a liquid composition for etching a metal containing copper. The liquid composition may include hydrogen peroxide in a range of about 0.1 wt % to about 10 wt % and a buffer solution in a range of about 0.1 wt % to about 10 wt %. The buffer solution may include citrate. The liquid composition may have a pH in a range of about 4.0 to about 7.0.

18 Claims, 6 Drawing Sheets

(51) Int. Cl.
*H01L 21/3213* (2006.01)
*H01L 23/00* (2006.01)

(52) U.S. Cl.
CPC ......... *H01L2224/05184* (2013.01); *H01L 2224/05186* (2013.01); *H01L 2224/05647* (2013.01); *H01L 2224/1147* (2013.01); *H01L 2224/11462* (2013.01); *H01L 2224/11849* (2013.01); *H01L 2224/13082* (2013.01); *H01L 2224/13111* (2013.01); *H01L 2224/13144* (2013.01); *H01L 2224/13147* (2013.01); *H01L 2224/13155* (2013.01)

(56) References Cited

U.S. PATENT DOCUMENTS

| | | |
|---|---|---|
| 8,395,270 B2 | 3/2013 | Kang et al. |
| 2008/0014746 A1* | 1/2008 | Chikarmane ..... H01L 21/02074 438/687 |
| 2008/0045035 A1 | 2/2008 | Lee et al. |
| 2009/0218230 A1 | 9/2009 | Iijima |
| 2010/0276787 A1 | 11/2010 | Yu et al. |
| 2011/0100956 A1* | 5/2011 | Keleher ................ C09G 1/02 216/37 |
| 2012/0009777 A1 | 1/2012 | Liu et al. |
| 2012/0064712 A1* | 3/2012 | Lei ................... H01L 21/67028 438/614 |

FOREIGN PATENT DOCUMENTS

| | | |
|---|---|---|
| JP | 2009-206334 A | 9/2009 |
| KR | 10-0273928 B1 | 9/2000 |
| KR | 1020010068233 A | 7/2001 |
| KR | 10-0323657 B1 | 1/2002 |
| KR | 1020020054886 A | 7/2002 |
| KR | 1020070103856 A | 10/2007 |
| KR | 1020080016009 A | 2/2008 |
| KR | 1020090053679 A | 5/2009 |
| KR | 1020100119507 A | 11/2010 |
| KR | 1020110077734 A | 7/2011 |
| KR | 1020110112181 A | 10/2011 |
| KR | 1020120028205 A | 3/2012 |

* cited by examiner

LIQUID COMPOSITIONS AND METHODS OF FABRICATING A SEMICONDUCTOR DEVICE USING THE SAME

CROSS-REFERENCE TO RELATED APPLICATION

This application claims the benefit of and priority under 35 U.S.C. §119 to Korean Patent Application No. 10-2013-0111882, filed on Sep. 17, 2013, the disclosure of which is hereby incorporated herein by reference in its entirety.

FIELD

The present disclosure herein relates to liquid compositions and methods of fabricating a semiconductor device using the same. A liquid composition according to embodiments of the present inventive concepts may be used for etching a metal containing copper, more particularly, a liquid composition according to embodiments of the present inventive concepts may selectively remove a desired copper layer.

BACKGROUND

Copper is a conductive material and is used in various fields, for example, a semiconductor integrated circuit, an opto-electronic communication field, and a micro-electro mechanical system (MEMS). Copper may be used as a seed layer for forming a metal layer or a metal interconnection along with aluminum, chromium, or titanium in a semiconductor device. Thus, semiconductor processes for forming a semiconductor device may need a process of selectively etching a metal layer including copper.

SUMMARY

Various embodiments of the present inventive concepts may provide a liquid composition capable of effectively etching a metal layer containing copper.

In some embodiments of the present inventive concepts, a method of fabricating a semiconductor device having improved reliability may be provided compared to a semiconductor device fabricated in the absence of a method of the present inventive concepts.

In one aspect, embodiments of the present inventive concepts provide a liquid composition for etching a metal containing copper. The liquid composition may include: hydrogen peroxide in a range of about 0.1 wt % to about 10 wt % and a buffer solution in a range of about 0.1 wt % to about 10 wt %. The buffer solution may include citrate. The liquid composition may have a pH in a range of about 4.0 to about 7.0.

In some embodiments, the buffer solution may include ammonium citrate.

In some embodiments, the liquid composition may further include an organic acid in a range of about 0.1 wt % to about 10 wt %.

In some embodiments, the buffer solution may include potassium citrate.

In some embodiments, the organic acid may include citric acid.

In some embodiments, the liquid composition may further include deionized water in a range of about 1 wt % to about 99.7 wt %.

According to some embodiments, a composition may be provided including hydrogen peroxide in a range of about 0.1 wt % to about 10 wt % and a buffer solution in a range of about 0.1 wt % to about 10 wt %, wherein the composition has a pH in a range of about 4.0 to about 7.0. The composition may further include an organic acid in a range of about 0.1 wt % to about 10 wt %. In certain embodiments, the composition may include hydrogen peroxide in a range of about 1.5 wt % to about 5 wt %; a buffer solution in a range of about 2 wt % to about 9 wt %; and optionally an organic acid in a range of about 0.1 wt % to about 5.5 wt %. The composition may further include deionized water in a range of about 80 wt % to about 98 wt %. In some embodiments, the buffer solution and/or organic acid are present in the composition in an amount sufficient to provide the composition with a pH in a range of about 4.0 to about 7.0.

In another aspect, embodiments of the present inventive concepts may provide a method of fabricating a semiconductor device. The method may include providing a liquid composition of the present inventive concepts on a substrate comprising a first metal layer and a second metal layer, the second metal layer including copper, to remove a portion of the second metal layer, thereby forming a second metal pattern.

In certain embodiments, the method may include: sequentially stacking a first metal layer and a second metal layer on a substrate, the second metal layer including copper; forming an etch mask layer on a portion of the second metal layer to expose a remaining portion of the second metal layer; and providing a liquid composition of the present inventive concepts on the substrate to remove the remaining portion of the second metal layer, thereby forming a second metal pattern. The liquid composition may be for etching the second metal layer. The liquid composition may have a pH in a range of about 4.0 to about 7.0, and the liquid composition may include: hydrogen peroxide in a range of about 0.1 wt % to about 10 wt % and a buffer solution in a range of about 0.1 wt % to about 10 wt %, the buffer solution including citrate.

In some embodiments, the second metal pattern may have a sidewall substantially perpendicular to a top surface of the first metal layer.

In some embodiments, the buffer solution may include ammonium citrate.

In some embodiments, the liquid composition may further include an organic acid in a range of about 0.1 wt % to about 10 wt %.

In some embodiments, the buffer solution may include potassium citrate.

In some embodiments, the liquid composition may further include deionized water in a range of about 1 wt % to about 99.7 wt %.

In some embodiments, providing the liquid composition may include: immersing and/or rotating the substrate in the liquid composition at a temperature in a range of about 20° C. to about 80° C.

In some embodiments, forming the etching mask layer may include: forming a photoresist pattern having an opening exposing a portion of the second metal layer, the opening corresponding to a metal pad formed on a top surface of the substrate; sequentially forming a metal pillar and a bump electrode in the opening; and removing the photoresist pattern to provide an etch mask.

In some embodiments, the method may further include: cleaning the substrate using deionized water after the formation of the second metal pattern; drying the substrate using an inert gas; and selectively removing the first metal layer exposed by the second metal pattern to form a first metal pattern.

BRIEF DESCRIPTION OF THE DRAWINGS

The above and other features and advantages of the disclosure will become more apparent in view of the attached drawings and accompanying detailed description.

DETAILED DESCRIPTION

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of the present inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this present inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 5:
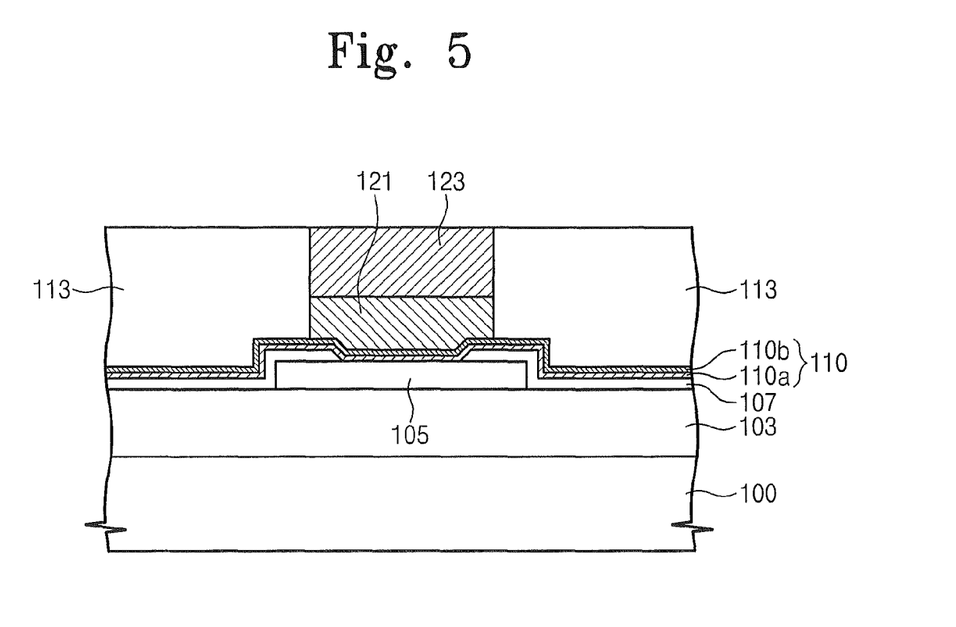
FIG. 5 is a cross-sectional view illustrating a semiconductor device according to various embodiments of the present inventive concepts.
Figure 6:
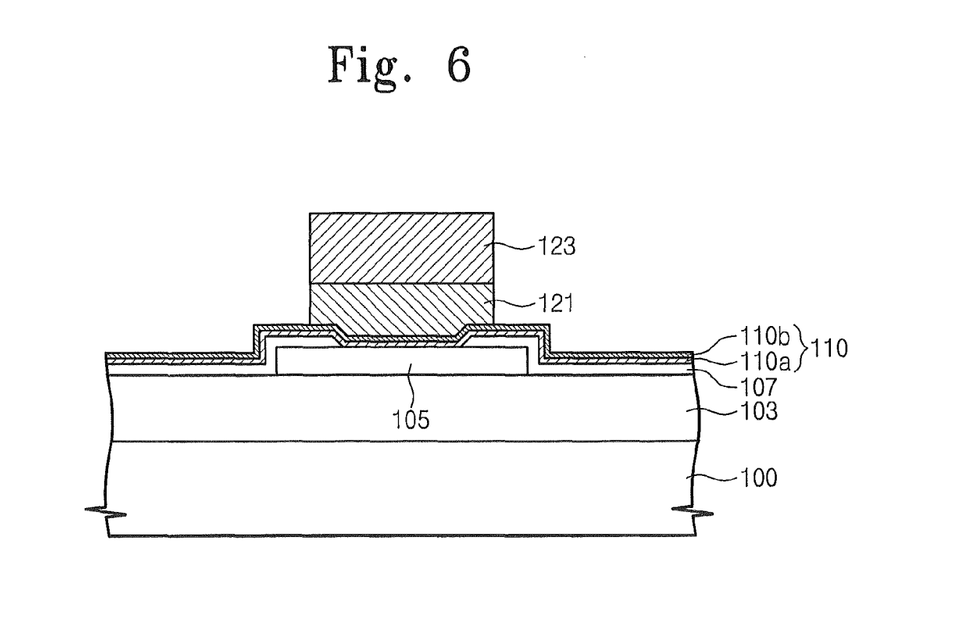
FIG. 6 is a cross-sectional view illustrating a semiconductor device according to various embodiments of the present inventive concepts.
Figure 7A:
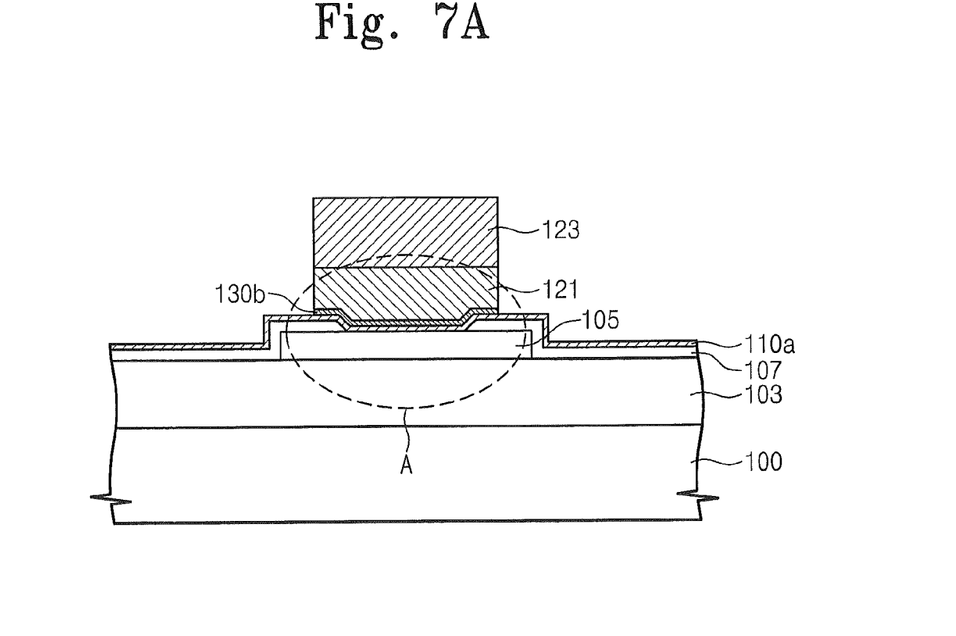
FIG. 7A is a cross-sectional view illustrating a semiconductor device according to various embodiments of the present inventive concepts.
Figure 7B:
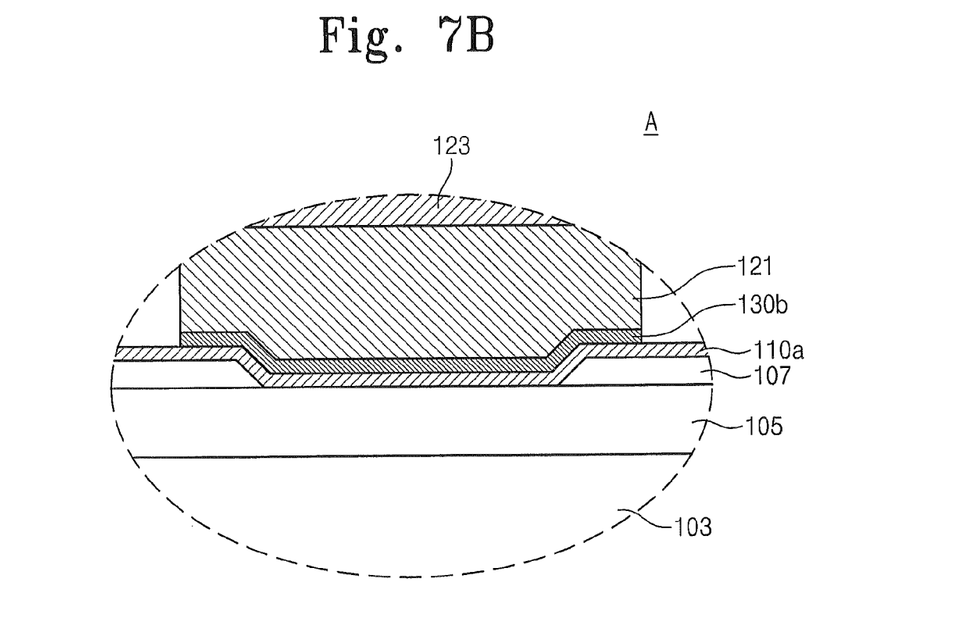
FIG. 7B is an enlarged view of portion "A" of FIG. 7A according to various embodiments of the present inventive concepts.

FIGS. 1 to 6, 7A and 8 are cross-sectional views illustrating a method of fabricating a semiconductor device according to example embodiments of the present inventive concepts, and FIG. 7B is an enlarged view of portion "A" of FIG. 7A. FIG. 9A is a cross-sectional view illustrating a semiconductor device in which an undercut is present, and FIG. 9B is an enlarged view of portion "B" of FIG. 9A.

Figure 1:
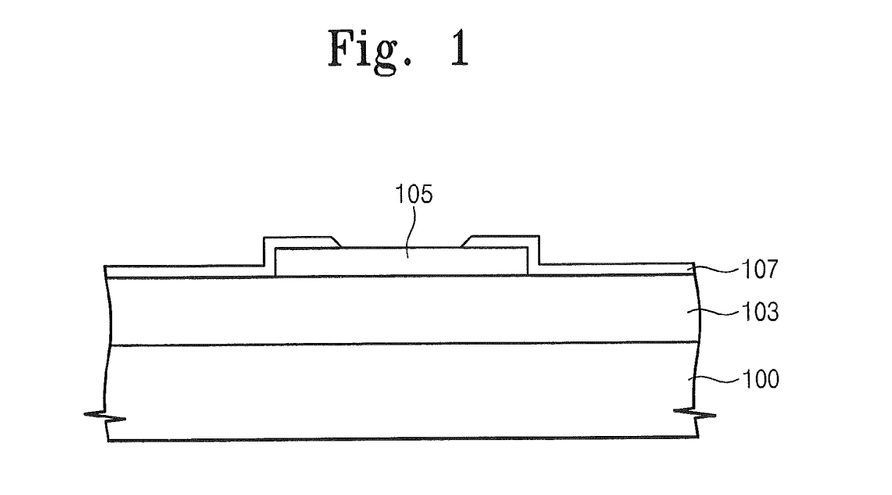
FIG. 1 is a cross-sectional view illustrating a semiconductor device according to various embodiments of the present inventive concepts.

Referring to FIG. 1, an interlayer insulating layer 103 is stacked on a semiconductor substrate 100. The semiconductor substrate 100 may be a silicon substrate, a silicon germanium substrate, a silicon carbide substrate, or a substrate including a semiconductor material such as gallium arsenide (GaAs). A semiconductor element (not shown) such as a transistor may be formed in a surface of the semiconductor substrate 100. The semiconductor element may be covered by the interlayer insulating layer 103. Metal lines and vias may be formed in the interlayer insulating layer 103. The metal lines and the vias may be electrically connected to the semiconductor element.

A metal pad 105 is formed on the interlayer insulating layer 103. The metal pad 105 may electrically connect the semiconductor element to an external system outside a chip. The metal pad 105 may include aluminum (Al), copper (Cu), silver (Ag), gold (Au), nickel (Ni), tungsten (W), and/or any alloy thereof. A passivation layer 107 is formed on the interlayer insulating layer 103. The passivation layer 107 partially covers the metal pad 105. In some embodiments, the passivation layer 107 may cover a top surface of the interlayer insulating layer 103 and an edge of a top surface of the metal pad 105. Thus, the passivation layer 107 may expose a portion of the metal pad 105, for example, a portion of a top surface of the metal pad 105, as illustrated in FIG. 1. The passivation layer 107 may be a single-layer or multi-layer which includes at least one of polyimide, silicon oxide, and silicon nitride.

Figure 2:
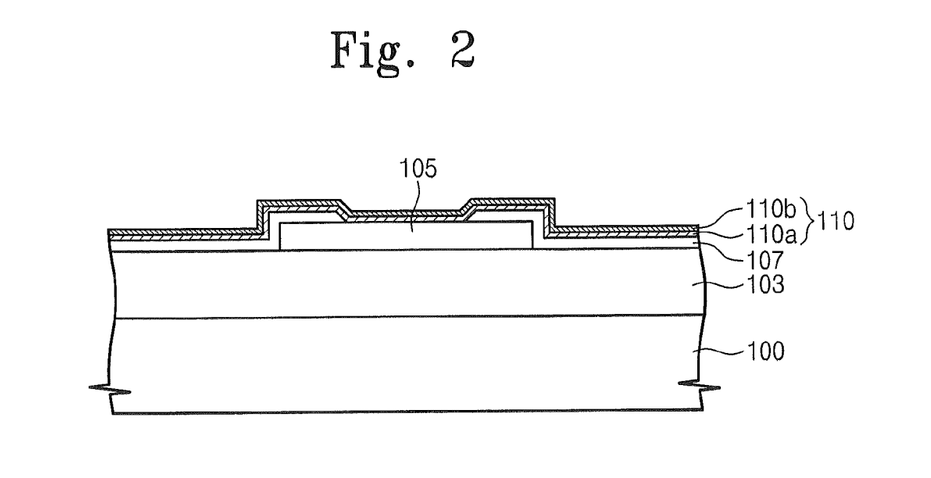
FIG. 2 is a cross-sectional view illustrating a semiconductor device according to various embodiments of the present inventive concepts.

Referring to FIG. 2, a bump lower electrode layer 110 is formed on the semiconductor substrate 100 having the passivation layer 107. The bump lower electrode layer 110 may be formed to cover the top surface of the metal pad 105, which is exposed by the passivation layer 107. The bump lower electrode layer 110 may include a barrier layer 110a and a seed layer 110b. In some embodiments, the bump lower electrode layer 110 may include the barrier layer 110a and the seed layer 110b that are sequentially formed on the passivation layer 107 and/or metal pad 105. The bump lower electrode layer 110 may be formed using at least one of a physical vapor deposition (PVD) process or other applicable processes. The barrier layer 110a may include at least one of titanium (Ti), titanium nitride (TiN), tantalum (Ta) or tantalum nitride (TaN). The seed layer 110b may include copper (Cu) and/or a copper alloy.

Figure 3:
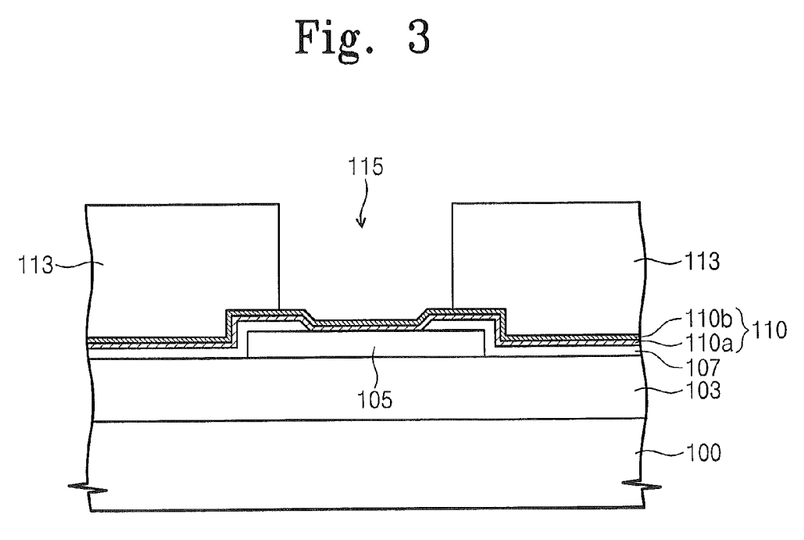
FIG. 3 is a cross-sectional view illustrating a semiconductor device according to various embodiments of the present inventive concepts.

Referring to FIG. 3, a photoresist pattern 113 is formed on the bump lower electrode layer 110. A photoresist layer (not shown) may be formed on the bump lower electrode layer 110 and then a photolithography process may be performed on the photoresist layer to form the photoresist pattern 113. The photoresist pattern 113 may include an opening 115 exposing a portion of the bump lower electrode layer 110. The opening 115 may expose the seed layer 110b of the bump lower electrode layer 110 contacting the metal pad 105. A top surface of the seed layer 110b not exposed by the opening 115 may be covered by the photoresist pattern 113.

Figure 4:
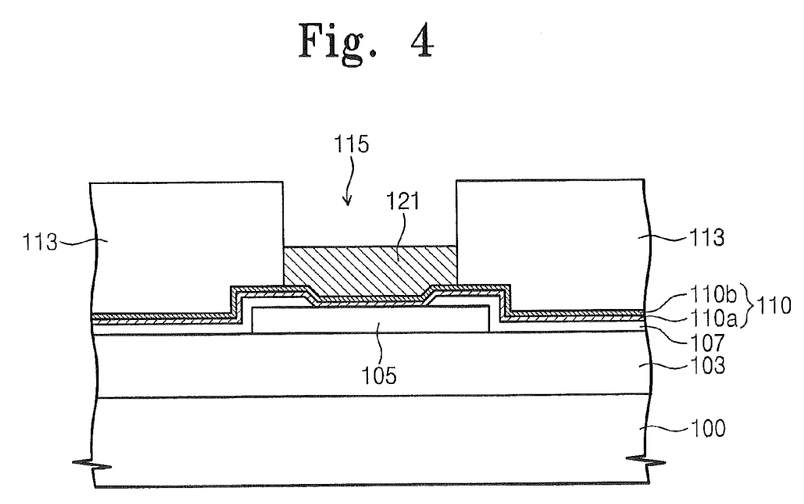
FIG. 4 is a cross-sectional view illustrating a semiconductor device according to various embodiments of the present inventive concepts.

Referring to FIGS. 4 and 5, a metal pillar 121 is formed in the opening 115. The metal pillar 121 may cover the seed layer 110b exposed by the opening 115 and may partially fill the opening 115. The metal pillar 121 may be formed by an electroplating method. The metal pillar 121 may include copper (Cu) and/or nickel (Ni).

A bump electrode 123 may be formed on the metal pillar 121 in the opening 115. The bump electrode 123 may completely fill the opening 115. The bump electrode 123 may be formed by an electroplating method. The bump electrode 123 may include copper (Cu), gold (Au), a tin-silver (Sn—Ag) alloy, and/or a tin-silver-copper (Sn—Ag—Cu) alloy.

Referring to FIG. 6, the photoresist pattern 113 is removed after the formation of the bump electrode 123. Thus, the surface of the seed layer 110b covered by the photoresist pattern 113 may be exposed. The photoresist pattern 113 may be removed by performing an ashing process or a stripping process.

Referring to FIGS. 7A and 7B, the seed layer 110b exposed by the removal of the photoresist pattern 113 may be selectively removed to form a seed pattern 130b. In some embodiments, a liquid composition according to the present inventive concepts, such as, a liquid composition for etching a metal containing copper, may be provided on the semiconductor substrate 100 in order to selectively remove the exposed portion of the seed layer 110b, by using the metal pillar 121 and the bump electrode 123 as an etch mask. The semiconductor substrate 100 may be contacted (e.g., immersed, dipped, sprayed, painted, and the like) with the liquid composition to selectively remove an exposed portion of the seed layer 110b. In some embodiments, the semiconductor substrate 100 may be immersed in the liquid composition and then may be rotated to remove the exposed seed layer 110b.

A portion of the seed layer 110b may be selectively removed using the liquid composition by immersing and/or rotating the semiconductor substrate 100 in the liquid composition for a time of in a range of about 1 minute to about 5 minutes. Subsequently, a drying process may be performed using an inert gas such as an argon gas and/or a nitrogen gas. In some embodiments, the rotating step may be performed by rotating the wafer at 50-2000 RPM and spraying the liquid composition on the wafer simultaneously. The wafer may be rotated clockwise or counterclockwise.

The liquid composition that may be used to etch the seed layer 110b may include hydrogen peroxide in a range of about 0.1 wt % to about 10 wt % and a buffer solution in a range of about 0.1 wt % to about 10 wt %. The liquid composition may further include an organic acid in a range of about 0.1 wt % to about 10 wt % and/or deionized water in a range of about 1 wt % to about 99.7 wt %. In some embodiments, the liquid composition may include hydrogen peroxide in a range of about 2 wt % to about 3 wt %, an organic acid in a range of about 0.8 wt % to about 1.2 wt %, a buffer solution in a range of about 4 wt % to about 6 wt %, and deionized water in a range of about 89.8 wt % to about 93.2 wt %.

When an exposed seed layer 110b is etched, the liquid composition for etching the metal containing copper may be maintained at a temperature in a range of about 20° C. to about 80° C. In some embodiments, the amount of each of the following components does not exceed 10 wt %: hydrogen peroxide, the organic acid, and the buffer solution. If the amount of hydrogen peroxide, the organic acid, or the buffer solution exceeds 10 wt %, then the amount of etching of the seed layer 110b may be increased such that an undercut phenomenon may be excessively caused. Additionally, if a liquid composition is used having a buffer solution present in an amount that exceeds 10 wt %, then it may be difficult to remove the barrier layer 110a in a subsequent process of removing the barrier layer 110a.

Hydrogen peroxide in the liquid composition may be used as an oxidizer. Thus, hydrogen peroxide may oxidize the seed layer 110b exposed by removing the photoresist pattern 113 with the metal pillar 121 and the bump electrode 123 being used as an etch mask. According to some embodiments of the present inventive concepts, the seed layer 110b may be oxidized and converted into a copper oxide (CuO) layer.

Organic acid present in a liquid composition according to embodiments of the present inventive concepts may be substantially used as an etching solution. Thus, an organic acid may remove the oxidized seed layer 110b when present in a liquid composition. In some embodiments, the organic acid may be citric acid.

The buffer solution in the liquid composition may be used as a pH control agent. Thus, the buffer solution may control the pH of the liquid composition and may inhibit galvanic corrosion caused during the removal of the seed layer 110b. The buffer solution may maintain the pH of the liquid composition in a range of about 4.0 to about 7.0. Galvanic corrosion is corrosion between dissimilar metals. For example, galvanic corrosion may be caused between the barrier layer 110a and the seed layer 110b.

The buffer solution may inhibit an oxidation reaction from occurring at the portion of the seed layer 110b contacting the metal pillar 121, but may cause an oxidation reaction at the barrier layer 110a. Thus, electrons in the barrier layer 110a may be supplied to the seed layer 110b. According to some embodiments of the present inventive concepts, the buffer solution may include a compound including citrate. For example, the buffer solution may include ammonium citrate and/or potassium citrate. If the buffer solution includes ammonium citrate, the liquid composition for etching the metal containing copper may not include an organic acid. According to other embodiments of the present inventive concepts, the buffer solution may include a compound including an alkali-metal ion combined with one or more hydroxyl groups (OH$^-$). For example, the buffer solution may include potassium hydroxide (KOH) and/or sodium hydroxide (NaOH). According to still other embodiments of the present inventive concepts, the buffer solution may include ammonium hydroxide (NH$_4$OH). According to yet other embodiments of the present inventive concepts, the buffer solution may not include a compound that includes a phosphoric acid ion (PO$_4^{3-}$) and/or a sulfuric acid ion (SO$_4^{2-}$). For example, the buffer solution may include at least one of ammonium citrate, potassium citrate, potassium hydroxide, sodium hydroxide, and ammonium hydroxide.

As illustrated in FIGS. 7A and 7B, only the portion of the seed layer 110b not covered by the metal pillar 121 and the bump electrode 123 may be etched to form the seed pattern 130b having a sidewall substantially perpendicular to a top surface of the barrier layer 110a. Alternatively, if the seed layer 110b is etched using a liquid composition that does not have a pH in a range of about 4 to about 7, galvanic corrosion may be caused between the barrier layer 110a and the seed layer 110b. This will be described with reference to FIGS. 9A and 9B. Referring to FIGS. 9A and 9B, the seed layer 110b not covered by the etch mask (i.e., the metal pillar 121 and the bump electrode 123) may partially corrode by galvanic corrosion and then the corroding portion of the seed layer 110b may be etched by the liquid composition. Thus, a seed pattern 230b having a concave sidewall may be formed. An undercut may thus be formed at each side of the seed pattern 230b and under the metal pillar 121. Thus, the contact area between the seed pattern 230b and the metal pillar 121 may be reduced compared to the contact area resulting from a method of the present inventive concepts, such as, for example, the contact area between the seed pattern 130b and the metal pillar 121 as illustrated in FIGS. 7A and 7B.

As a result, the undercut caused by etching a copper seed layer of a semiconductor device may be reduced or minimized by using a liquid composition according to embodiments of the present inventive concepts. Additionally, the undercut may be minimized such that the contact area of the seed pattern 130b and the metal pillar 121 may be increased to provide a semiconductor device having improved reliability. An undercut may deteriorate shear strength in a subsequent solder ball process such that a ball attach defect may be caused. Thus, a composition and/or method according to embodiments of the present inventive concepts may increase or improve shear strength and/or may prevent or reduce ball attach defects.

Figure 8:
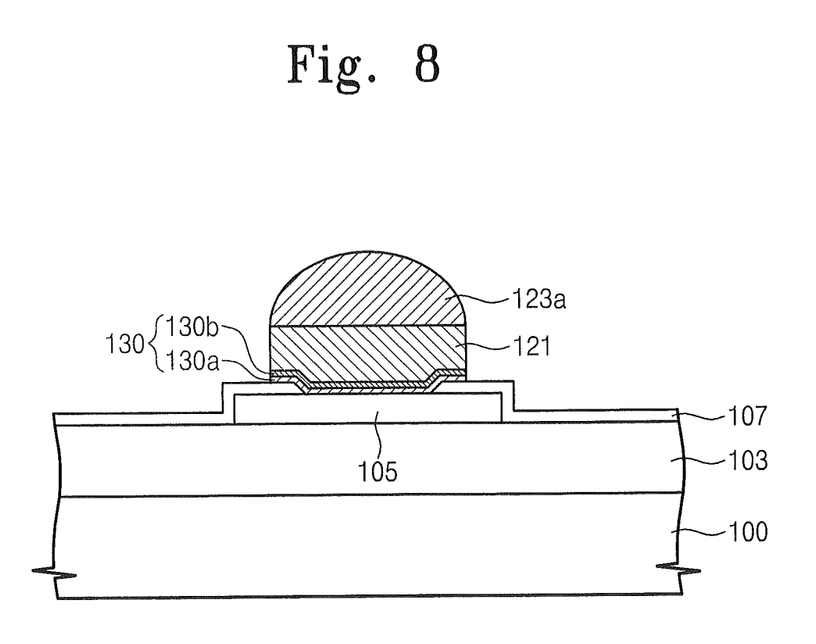
FIG. 8 is a cross-sectional view illustrating a semiconductor device according to various embodiments of the present inventive concepts.
Figure 9A:
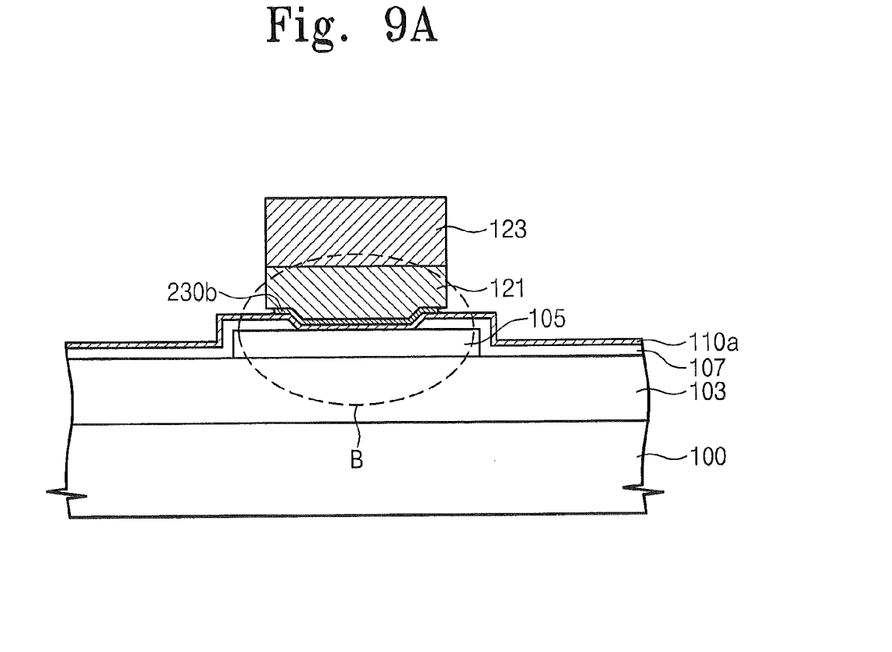
FIG. 9A is a cross-sectional view illustrating a semiconductor device with an undercut according to various embodiments of the present inventive concepts.
Figure 9B:
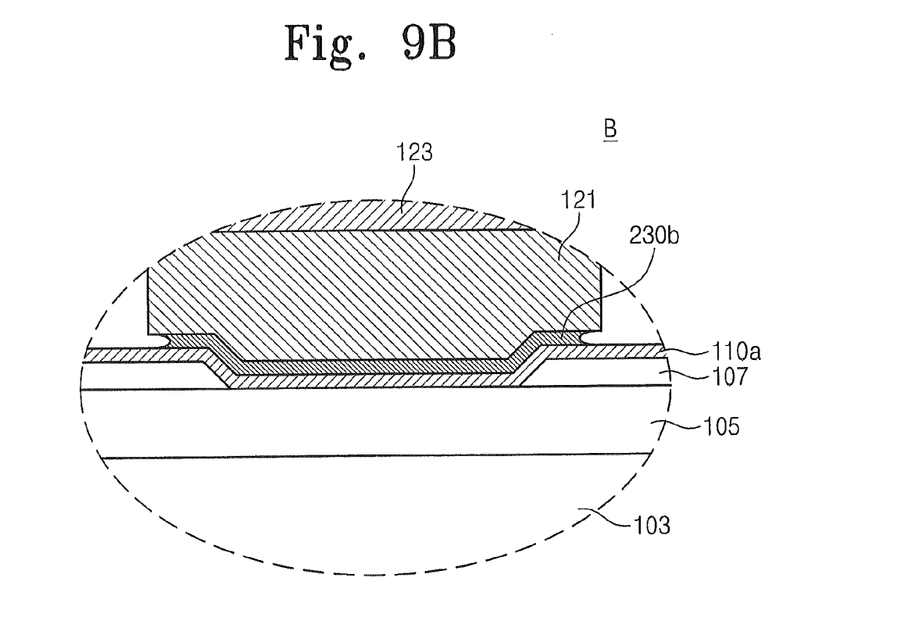
FIG. 9B is an enlarged view of portion "B" of FIG. 9A according to various embodiments of the present inventive concepts.

Referring to FIG. 8, the barrier layer 110a exposed by the seed pattern 130b is removed to form a barrier pattern 130a, thereby forming a bump lower electrode pattern 130. The barrier layer 110a may be anisotropically etched by providing an etching solution on the semiconductor substrate 100 having the seed pattern 130b. The etching solution may include hydrofluoric acid. The barrier layer 110a may be selectively removed to expose a top surface of the passivation layer 107. To selectively remove the barrier layer 110a, the semiconductor substrate 100 may be immersed and/or rotated in the etching solution for a time in a range of about 1 minute to about 5 minutes. Subsequently, a drying process may be performed using an inert gas such as an argon gas and/or a nitrogen gas.

After the drying process of the semiconductor substrate 100, a reflow process may be performed to melt and then congeal the bump electrode 123, thereby forming a solder bump 123a.

Experimental examples with respect to a liquid composition according to the present inventive concepts will be described hereinafter.

EXAMPLES

Manufacture of a Liquid Composition for Etching a Metal Containing Copper

Hydrogen peroxide (H$_2$O$_2$), a buffer solution, and citric acid were mixed according to composition ratios expressed in the following Tables 1 and 2, thereby forming liquid compositions of embodiments 1 to 17 and comparison examples 1 to 3 in Table 1 and liquid compositions of comparison examples 4 to 13 in Table 2.

Measurement of Undercut of Copper Seed Layer Provided with a Liquid Composition for Etching a Metal Containing Copper Wafers were prepared for the measurement. The barrier layer 110a including titanium and the seed layer 110b including copper were sequentially formed on each of the wafers, as illustrated in FIG. 6. A mask such as the metal pillar 121 of FIG. 6 was formed on a portion of the copper seed layer in order to expose a remaining portion of the copper seed layer. The wafers were immersed in the liquid compositions of embodiments 1 to 17 and the comparison examples 1 to 13 at a temperature in a range of about 30° C. to about 40° C. for a time in a range of about 1 minute to about 5 minutes. Next, the wafers were immersed in deionized water for about 5 minutes to perform subsequent etching and rinse processes. Subsequently, the wafers were dried by providing an argon (Ar) gas or a nitrogen (N$_2$) gas. The undercuts of the copper seed layers of the wafers were measured using a scanning electron microscope (SEM). The measured results are shown in the following Tables 1 and 2.

TABLE 1

Composition and undercut result for liquid compositions of embodiments 1 to 17 and comparison examples 1 to 3.

| | $H_2O_2$ (wt %) | Buffer solution (wt %) | | | | pH (25° C.) | Undercut (μm) J/T x 1.5 |
| --- | --- | --- | --- | --- | --- | --- | --- |
| | | Potassium citrate | Potassium hydroxide | Ammonium citrate | Citric acid (wt %) | | |
| Embodiment 1 | 2.5 | 6.4 | — | — | 0.5 | 6.02 | Excellent |
| Embodiment 2 | 2.5 | 6.4 | — | — | 1 | 5.57 | Excellent |
| Embodiment 3 | 2.5 | 4.9 | — | — | 1 | 5.30 | Excellent |
| Embodiment 4 | 2.5 | 4.4 | — | — | 1 | 5.29 | Excellent |
| Embodiment 5 | 2.5 | 3.9 | — | — | 1 | 5.26 | Excellent |
| Embodiment 6 | 2.5 | 3.4 | — | — | 1 | 5.25 | Excellent |
| Embodiment 7 | 2.5 | 2.9 | — | — | 1 | 5.15 | Excellent |
| Embodiment 8 | 3.5 | 6.4 | — | — | 1 | 5.50 | Excellent |
| Embodiment 9 | 4.5 | 6.4 | — | — | 1 | 5.45 | Excellent |
| Embodiment 10 | 2.0 | 6.4 | — | — | 1 | 5.62 | Excellent |
| Embodiment 11 | 2.5 | — | 3.3 | — | 4.8 | 5.52 | Excellent |
| Embodiment 12 | 2.5 | — | 2.6 | — | 4.0 | 5.36 | Excellent |
| Embodiment 13 | 2.5 | — | — | 4.4 | — | 5.08 | Excellent |
| Embodiment 14 | 2.5 | — | — | 6.4 | — | 5.13 | Excellent |
| Embodiment 15 | 2.5 | — | — | 8.4 | — | 5.15 | Excellent |
| Embodiment 16 | 3.5 | — | — | 4.4 | — | 4.86 | Excellent |
| Embodiment 17 | 4.5 | — | — | 4.4 | — | 4.82 | Excellent |
| Comparison example 1 | 2.5 | 6.4 | — | — | — | 7.40 | Bad |
| Comparison example 2 | 2.5 | — | — | 4.4 | 3 | 3.91 | Bad |
| Comparison example 3 | 2.5 | — | — | 4.4 | 5 | 3.89 | Bad |

(Undercut 0.4 μm or less: Excellent, 0.4 μm~0.6 μm: Normal, 0.6 μm or more: Bad)

TABLE 2

Composition and undercut result for comparison examples 4 to 13.

| | $H_2O_2$ (wt %) | Buffer solution (wt %) | | | Citric acid (wt %) | pH (25° C.) | Undercut (μm) J/T x 1.5 |
| --- | --- | --- | --- | --- | --- | --- | --- |
| | | TEP | Sodium persulfate | Potassium sulfate | | | |
| Comparison example 4 | 2.5 | — | — | — | 1.0 | 1.98 | Bad |
| Comparison example 5 | — | — | — | — | 3.7 | 1.84 | Bad |
| Comparison example 6 | — | 2.5 | — | — | — | 1.90 | Bad |
| Comparison example 7 | — | 5.0 | — | — | — | 1.89 | Bad |
| Comparison example 8 | — | — | 2.5 | — | — | 1.52 | Bad |
| Comparison example 9 | — | — | 5.0 | — | — | 1.45 | Bad |
| Comparison example 10 | — | — | — | 2.5 | — | 2.36 | Bad |
| Comparison example 11 | — | — | — | 5.0 | — | 2.51 | Bad |

TABLE 2-continued

Composition and undercut result for comparison examples 4 to 13.

| | Buffer solution (wt %) | | | | | Undercut |
|---|---|---|---|---|---|---|
| | $H_2O_2$ (wt %) | TEP | Sodium persulfate | Potassium sulfate | Citric acid (wt %) | pH (25° C.) | (μm) J/T x 1.5 |
| Comparison example 12 | — | — | | 2.5 | 3.7 | 2.25 | Bad |
| Comparison example 13 | — | — | | 5.0 | 3.7 | 2.40 | Bad |

(Undercut 0.4 μm or less: Excellent, 0.4 μm~0.6 μm: Normal, 0.6 μm or more: Bad)

Referring to the Table 1, for copper seed layers etched by embodiments 1 to 10 having potassium citrate as the buffer solution, the undercuts were about 0.4 μm or less. Additionally, for copper seed layers etched by embodiments 11 and 12 having potassium hydroxide as the buffer solution and embodiments 13 to 17 having ammonium citrate as the buffer solution, the undercuts were about 0.4 μm or less. Embodiments 13 to 17 having ammonium citrate as the buffer solution may reduce or minimize the undercut even though citric acid is not added into the liquid composition of embodiments 13 to 17.

In contrast, comparison example 1 had a pH greater than 7 such that the etch rate of the copper seed layer was reduced to cause the bad undercut characteristic. Even for comparison examples 2 and 3, which had ammonium citrate as the buffer solution, the pH of each of these compositions of comparison examples 2 and 3 was less than 4. Thus, comparison examples 2 and 3 did not improve the undercut characteristic of the copper seed layer. The etch rate of the copper seed layer 110b disposed under the metal pillar 121 may be fast by occurring galvanic corrosion between the metal pillar 121 and the copper seed layer 110b. Thus, the undercut of the copper seed layer 110b may be increased.

Referring to Table 2, comparison examples 6 to 13 included as the buffer solution triethyl phosphate (TEP) having phosphoric acid ions, sodium persulfate, or potassium sulfate having sulfuric acid ions. The compositions of comparison examples 4 and 5 did not include a buffer solution. The compositions of each of comparison examples 4 to 13 had a pH less than 3. Thus, the undercuts were 0.6 μm or more in the event that the copper seed layers were etched by a composition of comparison examples 4 to 13. This is because the buffer solutions of comparison examples 4 to 13 included phosphoric acid ions ($PO_4^{3-}$) or sulfuric acid ions ($SO_4^{2-}$) to maintain the pH of the liquid compositions of comparison examples 4 to 13 in a range of 1 to 3. As a result, the buffer solution according to embodiments of the present inventive concepts controls the pH of the liquid composition for etching the metal containing copper in the range of about 4.0 to about 7.0. Thus, the pH of the liquid composition for the etching the metal containing copper is an important factor in order to improve the undercut characteristic of a copper seed layer.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A liquid composition for etching a metal containing copper, the liquid composition consisting of:
   hydrogen peroxide in a range of about 0.1 wt % to about 10 wt %;
   a buffer solution in a range of about 0.1 wt % to about 10 wt %, the buffer solution including citrate;
   an organic acid in a range of about 0.1 wt % to about 10 wt %; and
   water,
   wherein the liquid composition has a pH in a range of about 4.0 to about 7.0.

2. The liquid composition of claim 1, wherein the buffer solution includes ammonium citrate.

3. The liquid composition of claim 1, wherein the buffer solution includes potassium citrate.

4. The liquid composition of claim 1, wherein the organic acid includes citric acid.

5. The liquid composition of claim 1, wherein the water is deionized water in a range of about 1 wt % to about 99.7 wt %.

6. The composition of claim 1, wherein
   the hydrogen peroxide is in a range of about 1.5 wt % to about 5 wt %;
   the buffer solution is in a range of about 2 wt % to about 9 wt %; and
   the organic acid is in a range of about 0.1 wt % to about 5.5 wt %.

7. A method of fabricating a semiconductor device, the method comprising:
   providing a liquid composition on a substrate comprising a first metal layer and a second metal layer, the second metal layer including copper, to remove a portion of the second metal layer, thereby forming a second metal pattern;
   cleaning the substrate using deionized water;
   drying the substrate using an inert gas; and
   selectively removing the first metal layer exposed by the second metal pattern to form a first metal pattern, wherein the liquid composition comprises: hydrogen peroxide in a range of about 0.1 wt % to about 10 wt %; and a buffer solution in a range of about 0.1 wt % to about 10 wt %, the buffer solution including citrate, wherein the liquid composition has a pH in a range of about 4.0 to about 7.0.

8. The method of claim 7, wherein the second metal pattern has a sidewall substantially perpendicular to a top surface of the first metal layer.

9. The method of claim 7, wherein the buffer solution includes ammonium citrate.

10. The method of claim 7, wherein the liquid composition further comprises an organic acid in a range of about 0.1 wt % to about 10 wt %.

11. The method of claim 10, wherein the buffer solution includes potassium citrate.

12. The method of claim 7, wherein the liquid composition further comprises deionized water in a range of about 1 wt % to about 99.7 wt %.

13. The method of claim 7, wherein providing the liquid composition on the substrate comprises:
   immersing or rotating the substrate in the liquid composition at a temperature in a range of about 20° C. to about 80° C.

14. The method of claim 7, further comprising
   forming a photoresist pattern having an opening exposing a portion of the second metal layer, the opening corresponding to a metal pad formed on a top surface of the substrate;
   sequentially forming a metal pillar and a bump electrode in the opening; and
   removing the photoresist pattern, thereby forming an etching mask layer.

15. A composition for etching a metal containing copper, the composition consisting essentially of:
   hydrogen peroxide in a range of about 0.1 wt % to about 10 wt %,
   a buffer solution in a range of about 0.1 wt % to about 10 wt %, the buffer solution including ammonium citrate;
   an organic acid in a range of about 0.1 wt % to less than 3 wt %; and
   water,
   wherein the composition has a pH in a range of about 4.0 to about 7.0.

16. The composition of claim 15, wherein the organic acid includes citric acid.

17. The composition of claim 16, wherein the citric acid is in a range of about 0.8 wt % to about 1.2 wt %.

18. The composition of claim 15, wherein the water is deionized water in a range of about 1 wt % to about 99.7 wt %.

* * * * *